(12) United States Patent
Hokoi et al.

(10) Patent No.: US 8,970,202 B2
(45) Date of Patent: Mar. 3, 2015

(54) SHIFT SENSOR AND VEHICLE INCLUDING THE SAME

(75) Inventors: Koji Hokoi, Toyota (JP); Yoshitaka Watanabe, Nagoya (JP); Junji Sato, Nagakute (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 14/119,021

(22) PCT Filed: Jul. 5, 2011

(86) PCT No.: PCT/JP2011/065321
§ 371 (c)(1),
(2), (4) Date: Nov. 20, 2013

(87) PCT Pub. No.: WO2013/005294
PCT Pub. Date: Jan. 10, 2013

(65) Prior Publication Data
US 2014/0117971 A1 May 1, 2014

(51) Int. Cl.
*G01R 19/00* (2006.01)
*G01N 27/00* (2006.01)
*G06F 17/00* (2006.01)
*B60K 20/00* (2006.01)
*F16H 61/02* (2006.01)
*G01R 19/155* (2006.01)
(Continued)

(52) U.S. Cl.
CPC .......... *F16H 61/0202* (2013.01); *G01R 19/155* (2013.01); *F16H 61/12* (2013.01); *F16H 59/105* (2013.01); *G01B 7/003* (2013.01)
USPC .......... 324/76.11; 324/71.1; 701/51; 701/52; 74/473.21

(58) Field of Classification Search
CPC ... F16H 61/0202; F16H 61/12; G16H 59/105; G01R 19/155; G01R 19/145; G01B 7/003
USPC .......... 324/76.11, 71.1; 701/51, 52; 74/473.21
See application file for complete search history.

(56) References Cited

U.S. PATENT DOCUMENTS 6,376,929 B1 4/2002 Nakajima
7,584,681 B2 * 9/2009 Kozaki et al. ............ 74/335
(Continued)

FOREIGN PATENT DOCUMENTS

| JP | 8-277913 A | 10/1996 |
| JP | 2000-179660 A | 6/2000 |

(Continued)

OTHER PUBLICATIONS

International Search Report of PCT/JP2011/065321, dated Aug. 23, 2011.

*Primary Examiner* — Amy He
(74) *Attorney, Agent, or Firm* — Sughrue Mion, PLLC

(57) ABSTRACT

A shift sensor includes a movable member, four movable contacts, seven fixed contacts, and two power supply terminals. Each of the movable contacts is fixed to the movable member and pivoted to a position corresponding to a shift position. Each of the fixed contacts outputs a shift signal when it is brought into conduction with a power supply terminal by coming into contact with any of the movable contacts. The fixed contacts are arranged such that the number of shift signals that differ between shift positions is three or more, between the shift positions of P, R, N, D, and B, except for between the D and B positions.

5 Claims, 9 Drawing Sheets

(51) Int. Cl.
*F16H 61/12* (2010.01)
*F16H 59/10* (2006.01)
*G01B 7/00* (2006.01)

(56) References Cited

U.S. PATENT DOCUMENTS

| | | | |
|---|---|---|---|
| 7,835,833 B2 * | 11/2010 | Mizutani | 701/31.7 |
| 7,874,225 B2 | 1/2011 | Kamada et al. | |
| 2008/0108480 A1 | 5/2008 | Kamada et al. | |
| 2010/0250055 A1 | 9/2010 | Ito et al. | |
| 2010/0281667 A1 | 11/2010 | Aisaki et al. | |

FOREIGN PATENT DOCUMENTS

| | | |
|---|---|---|
| JP | 2002-89676 A | 3/2002 |
| JP | 2005-104219 A | 4/2005 |
| JP | 2007-232022 A | 9/2007 |
| JP | 2008-115944 A | 5/2008 |
| JP | 2009-4246 A | 1/2009 |
| JP | 2009-133459 A | 6/2009 |
| JP | 2009-162287 A | 7/2009 |
| JP | 2009-280156 A | 12/2009 |
| JP | 2010-223355 A | 10/2010 |
| JP | 2011-80839 A | 4/2011 |

* cited by examiner

|     | T1 | T2 | T3 | T4 | T5 | T6 | T7 |
|-----|----|----|----|----|----|----|----|
| P   | 1  |    |    |    |    | 1  | 1  |
| S11 | 1  | 1  |    |    |    | 1  | 1  |
| S12 | 1  | 1  |    |    |    | 1  |    |
| R   |    | 1  |    |    |    | 1  |    |
| S21 |    | 1  | 1  |    |    | 1  |    |
| S22 |    | 1  | 1  |    |    | 1  | 1  |
| S23 |    | 1  | 1  |    |    |    | 1  |
| N   |    |    | 1  |    |    |    | 1  |
| S31 |    |    | 1  |    |    |    |    |
| S32 |    |    | 1  | 1  |    |    |    |
| S33 |    |    | 1  | 1  | 1  |    |    |
| D   |    |    |    | 1  | 1  |    |    |
| B   |    |    |    | 1  | 1  |    | 1  |

FIG.7

| | P | S11 | S12 | R | S21 | S22 | N | S31 | S32 | D | S41 | B |
|---|---|---|---|---|---|---|---|---|---|---|---|---|
| R1 | | T1 | | | | | T3 | | | | | |
| RB1 | | | | | | B1 | | | | | | |
| R2 | | | T6 | | | | | | T4 | | | |
| R3 | | | | | | | | | | | T5 | |
| RB2 | | | | | | B2 | | | | | | |
| R4 | T7 | | | | | | | | | | | T7 |

FIG.8

|  | T1 | T2 | T3 | T4 | T5 | T6 | T7 |
|---|---|---|---|---|---|---|---|
| P | 1 |  |  |  |  | 1 | 1 |
| S11 | 1 | 1 |  |  |  | 1 | 1 |
| S12 | 1 | 1 |  |  |  | 1 |  |
| R |  | 1 |  |  |  | 1 |  |
| S21 |  | 1 | 1 |  |  | 1 |  |
| S22 |  | 1 | 1 |  |  |  |  |
| N |  |  | 1 |  |  |  |  |
| S31 |  |  | 1 | 1 |  |  |  |
| S32 |  |  | 1 | 1 | 1 |  |  |
| D |  |  |  | 1 | 1 |  |  |
| S41 |  |  |  | 1 | 1 |  | 1 |
| B |  |  |  |  | 1 |  | 1 |

FIG.10

|  | T1 | T2 | T3 | T4 | T5 | T6 | T7 |
|---|---|---|---|---|---|---|---|
| P |  | 1 |  |  |  | 1 | 1 |
| S11 |  | 1 | 1 |  |  | 1 | 1 |
| S12 |  | 1 | 1 |  |  |  | 1 |
| S13 |  | 1 | 1 |  |  |  |  |
| S14 | 1 | 1 | 1 |  |  |  |  |
| R | 1 | 1 |  |  |  |  |  |
| S21 | 1 |  |  |  |  |  |  |
| S22 | 1 |  | 1 |  |  |  |  |
| N | 1 |  | 1 | 1 |  |  |  |
| S31 |  |  | 1 | 1 |  |  |  |
| S32 |  |  |  | 1 |  |  |  |
| D |  |  |  | 1 |  | 1 |  |
| S41 |  |  |  | 1 | 1 | 1 |  |
| B |  |  |  |  | 1 | 1 |  |

SHIFT SENSOR AND VEHICLE INCLUDING THE SAME

CROSS REFERNCE TO RELATED APPLICATIONS

This application is a National Stage of International Application No. PCT/JP2011/065321, filed Jul. 5, 2011, the contents of all which are incorporated herein by reference in their entirety.

TECHNICAL FIELD

This invention relates to a shift sensor for shift-by-wire and a vehicle including the shift sensor.

BACKGROUND ART

Conventionally, a vehicle is known in which a shift range can be switched in response to an output signal from a shift sensor for detecting a position of a shift lever operated by a driver.

With regard to such a vehicle, Japanese Patent Laying-Open No. 2008-115944 (PTL 1), for example, discloses a technique in which a position of a shift lever (shift position) is determined based on a combination of signals detected by a plurality of (three) magnetic field detection sensors provided on a movement path of the shift lever.

CITATION LIST

Patent Literature

PTL 1: Japanese Patent Laying-Open No. 2008-115944
PTL 2: Japanese Patent Laying-Open No. 2009-4246
PTL 3: Japanese Patent Laying-Open No. 2009-162287
PTL 4: Japanese Patent Laying-Open No. 2007-232022
PTL 5: Japanese Patent Laying-Open No. 8-277913
PTL 6: Japanese Patent Laying-Open No. 2010-223355

SUMMARY OF INVENTION

Technical Problem

In the technique disclosed in PTL 1, a case having only one signal that differs between shift positions is included, and therefore, in the event of a double failure in which any two of the plurality of magnetic field detection sensors fail, it is very likely that the shift position will be erroneously determined. Accordingly, there has been room for further improvement.

The present invention was made in order to solve the above-described problem, and an object thereof is to realize a shift sensor for shift-by-wire that is advantageous both in terms of cost and performance and can also ensure fail-safe performance.

Solution to Problem

A shift sensor according to this invention detects a shift range requested by a user by electrically detecting a position of a movable member operated by the user. This shift sensor includes a movable contact configured to be movable to a position corresponding to the position of the movable member, a power supply terminal extending substantially parallel to a movement path of the movable contact and being constantly in contact with the movable contact, and a plurality of fixed contacts each extending substantially parallel to the movement path of the movable contact, for outputting a signal by coming into contact with the movable contact in accordance with the position of the movable contact. The plurality of fixed contacts are arranged such that the number of signals that differ between signal patterns including a signal pattern for a parking position, a signal pattern for a rearward position, a signal pattern for a neutral position, and a signal pattern for a forward position is three or more.

Preferably, the plurality of fixed contacts are arranged such that the number of signals that differ between the signal pattern for the forward position and the signal pattern for the parking position, the number of signals that differ between the signal pattern for the forward position and the signal pattern for the rearward position, and the number of signals that differ between the signal pattern for the forward position and the signal pattern for the neutral position are all four or more.

Preferably, the plurality of fixed contacts are arranged to be able to output two or more different signal patterns in accordance with the position of the movable member, in each of an intermediate position between the parking position and the rearward position, an intermediate position between the rearward position and the neutral position, and an intermediate position between the neutral position and the forward position.

Preferably, the plurality of fixed contacts are arranged on any of a plurality of tracks substantially parallel to the movement path of the movable contact, so as not to cross one another.

Preferably, the plurality of tracks are constituted of a first track, a second track, a third track, and a fourth track. The power supply terminal is constituted of a first power supply terminal arranged between the first track and the second track and a second power supply terminal arranged between the third track and the fourth track. The movable contact is constituted of a first movable contact configured to allow conduction between the first power supply terminal and the fixed contact on the first track, a second movable contact configured to allow conduction between the first power supply terminal and the fixed contact on the second track, a third movable contact configured to allow conduction between the second power supply terminal and the fixed contact on the third track, and a fourth movable contact configured to allow conduction between the second power supply terminal and the fixed contact on the fourth track.

Preferably, a vehicle includes a shift sensor for detecting a shift range requested by a user by electrically detecting a position of a movable member operated by the user. The shift sensor includes a movable contact configured to be movable to a position corresponding to the position of the movable member, a power supply terminal extending substantially parallel to a movement path of the movable contact and being constantly in contact with the movable contact, and a plurality of fixed contacts each extending substantially parallel to the movement path of the movable contact, for outputting a signal by coming into contact with the movable contact in accordance with the position of the movable contact. The plurality of fixed contacts are arranged such that the number of signals that differ between signal patterns including a signal pattern for a parking position, a signal pattern for a rearward position, a signal pattern for a neutral position, and a signal pattern for a forward position is three or more.

Advantageous Effects Of Invention

According to the present invention, a shift sensor for shift-by-wire that is advantageous both in terms of cost and performance and can also ensure fail-safe performance can be realized.

BRIEF DESCRIPTION OF DRAWINGS

FIG. 7 is a diagram schematically showing a first modification of the arrangement of fixed contacts T1 to T7.

FIG. 8 is a diagram showing ON/OFF timing of each shift signal in the first modification.

FIG. 10 is a diagram showing ON/OFF timing of each shift signal in the second modification.

DESCRIPTION OF EMBODIMENTS

Embodiments of the present invention will be described hereinafter, with reference to the drawings. In the following description, identical parts are denoted by identical symbols. The labels and functions thereof are also the same. Accordingly, detailed description thereof will not be repeated.

Figure 1:
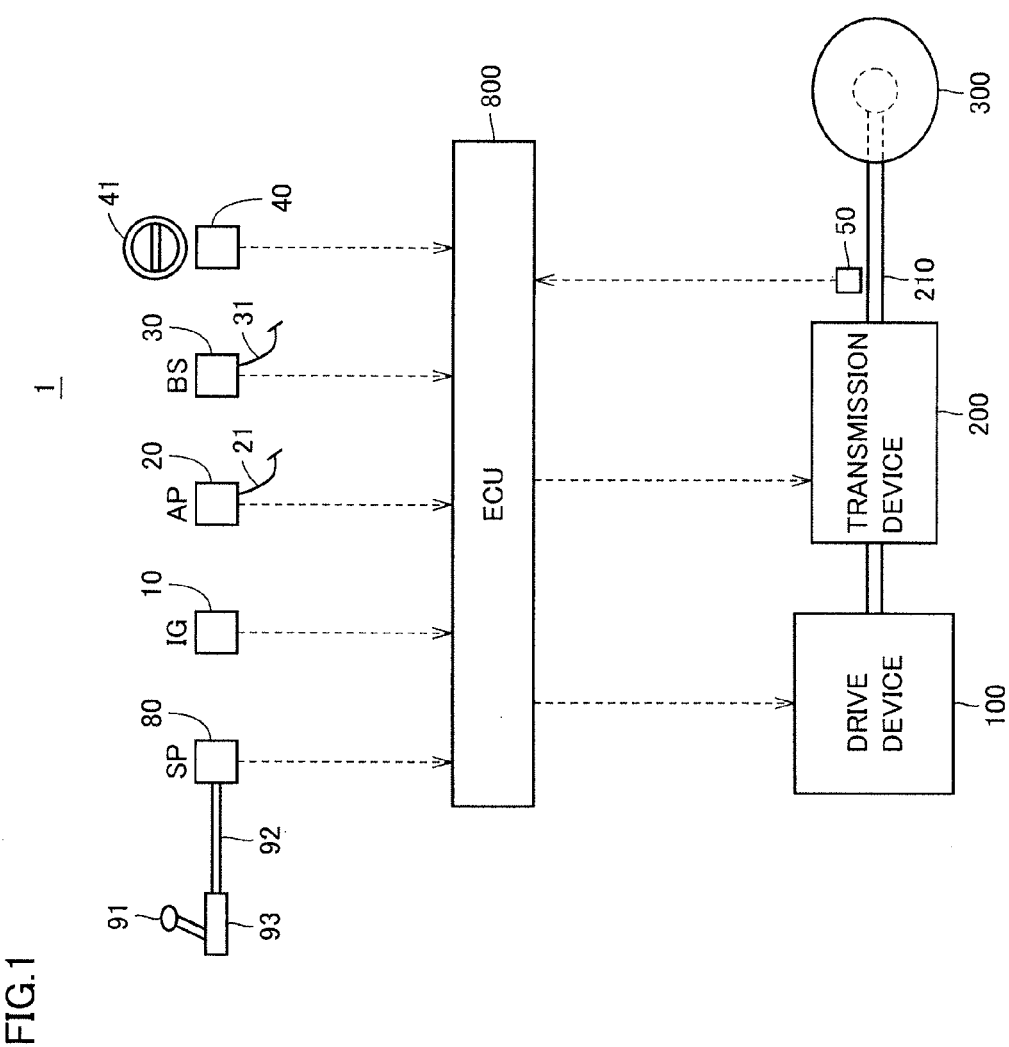
FIG. 1 is an overall block diagram of a vehicle having a shift sensor mounted thereon.

FIG. 1 is an overall block diagram of a vehicle 1 having a shift sensor 80 according to the present embodiment mounted thereon. Vehicle 1 includes a drive device 100, a transmission device 200, a wheel 300, and an ECU (Electronic Control Unit) 800. Vehicle 1 further includes an IG switch 10, an accelerator pedal 21, a brake pedal 31, a steering wheel 41, and a shift lever 91, which are operated by a driver. Vehicle 1 further includes an accelerator position sensor 20, a brake stroke sensor 30, a steering angle sensor 40, a vehicle speed sensor 50, and shift sensor 80.

Drive device 100 and transmission device 200 are controlled by a control signal from ECU 800.

Drive device 100 is a device that generates driving force for vehicle 1. Drive device 100 is representatively constituted of an engine, a motor, and the like.

Transmission device 200 is provided between drive device 100 and wheel 300, and changes a rotation speed of drive device 100 and transmits the resultant rotation speed to wheel 300. Transmission device 200 includes a plurality of friction engagement elements (a clutch and a brake) for switching a power transmission direction and a gear ratio, and a parking gear for fixing an output shaft 210 of transmission device 200. A control state of transmission device 200 (hereinafter also referred to as the "shift range") is switched to any of a P (parking) range, a R (reverse) range, a N (neutral) range, a D (drive) range, and a B (brake) range, in accordance with the control signal from ECU 800. This scheme of switching the shift range by electric control is also called a shift-by-wire scheme. In the D range, the B range and the R range, the driving force of drive device 100 is transmitted to wheel 300, causing vehicle 1 to run. In the D range and the B range, vehicle 1 is caused to run in a forward direction. The B range is a shift range in which an engine brake is more effective than in the D range. In the R range, vehicle 1 is caused to run in a rearward direction. In the N range, on the other hand, the driving force of drive device 100 is not transmitted to wheel 300. In the P range, the parking gear within transmission device 200 is actuated to fix output shaft 210, thus supressing rotation of wheel 300.

IG switch 10 is a switch for the driver to input requests for starting up and stopping a drive system of vehicle 1 (electrical equipment required to control running of vehicle 1). Positions to which IG switch 10 is operated include an IG-OFF position for bringing the drive system into a stop state (Ready-OFF state), an IG-ON position for applying electric power to the drive system, a start position for bringing the drive system into a startup state (Ready-ON state), and the like.

Accelerator position sensor 20 detects a position (accelerator position) AP of accelerator pedal 21. Brake stroke sensor 30 detects an amount of operation (brake stroke) BS of brake pedal 31. Steering angle sensor 40 detects a steering angle of steering wheel 41. Vehicle speed sensor 50 detects a vehicle speed V based on the rotation speed of output shaft 210 of transmission device 200.

Shift sensor 80 is mechanically connected by a push-pull cable 92 to shift lever 91, which is operated by the user along a shift gate 93. Shift sensor 80 outputs, to ECU 800, a shift signal corresponding to a position of shift lever 91 (hereinafter also referred to as the "shift position"). The shift signal is used by ECU 800 to determine (recognize) the shift range requested by the driver (hereinafter also referred to as the "requested range"). The shift signal includes a plurality of types of signals (7 types in the present embodiment, as will be described later).

ECU 800 has a not-shown CPU (Central Processing Unit) and a not-shown memory incorporated therein, and executes predetermined operation processing based on information stored in the memory and information from each sensor. Based on a result of the operation processing, ECU 800 controls various devices mounted on vehicle 1.

ECU 800 recognizes the requested range based on a combination of a plurality of types of shift signals received from shift sensor 80, and controls transmission device 200 so as to realize the recognized requested range.

Figure 2:
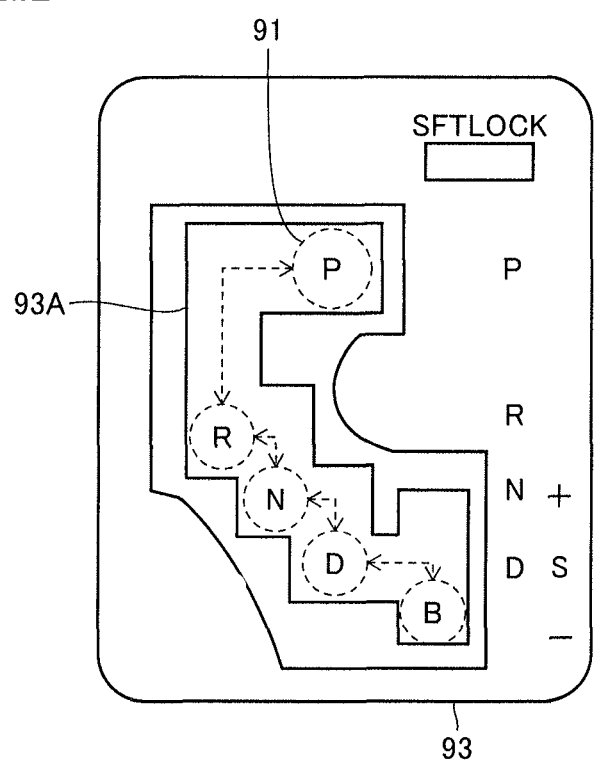
FIG. 2 is a diagram showing a shift gate.

FIG. 2 is a diagram showing shift gate 93. As shown in FIG. 2, shift gate 93 has a groove 93A for restricting a movement pathway of shift lever 91. Shift lever 91 is moved along groove 93A from the P position side to the P, R, N, D, and B positions in this order.

Figure 3:
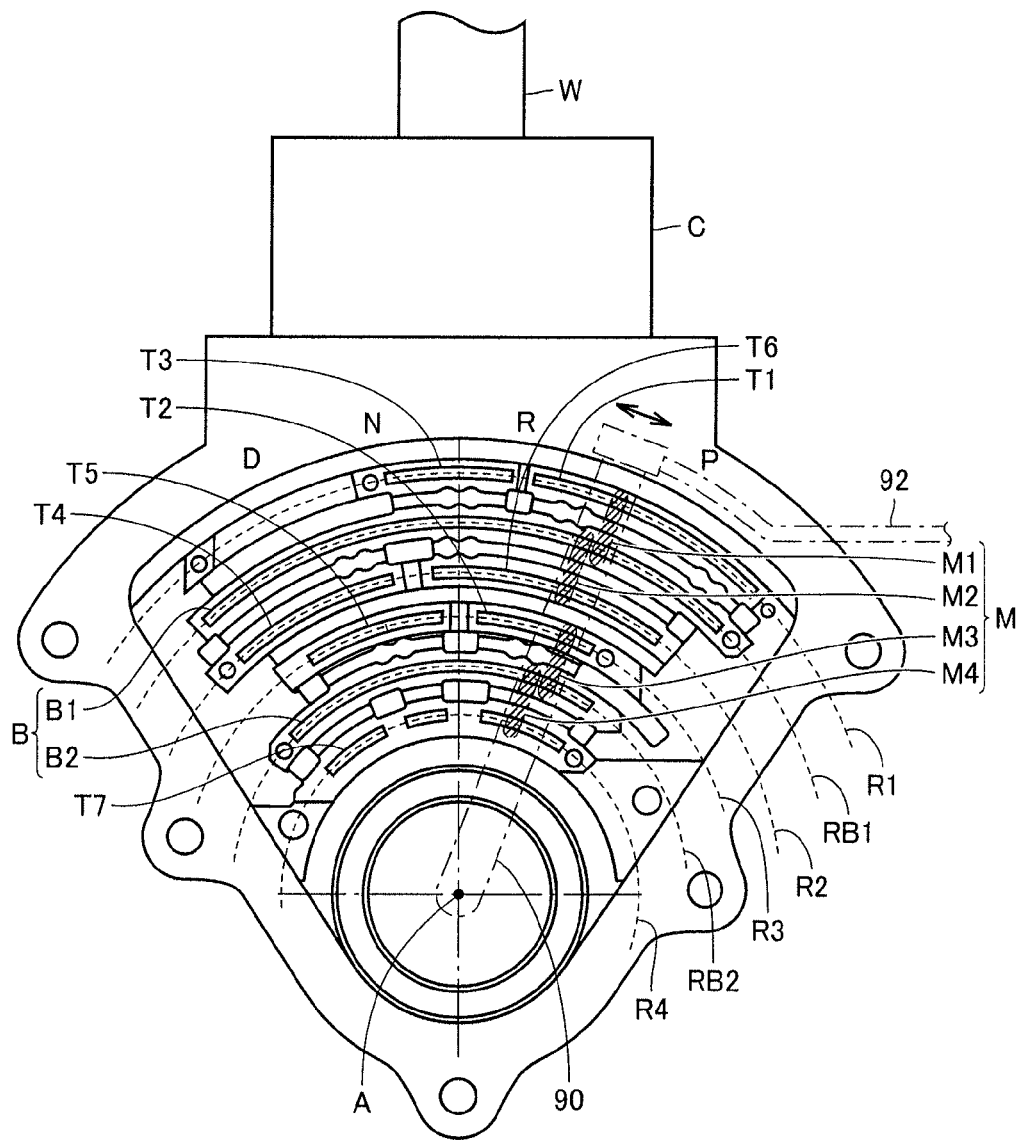
FIG. 3 is a diagram showing a structure of the shift sensor.

FIG. 3 is a diagram showing a structure of shift sensor 80. Shift sensor 80 includes a movable member 90, four movable contacts M (M1 to M4), seven fixed contacts T1 to T7, two power supply terminals B (B1, B2), and a shift connector C. Shift connector C is connected with ECU 800 by a shift wire W.

Movable member 90 has one end connected to shift lever 91 through push-pull cable 92, and the other end pivotably connected to a pivot shaft A. As push-pull cable 92 is pushed or pulled in accordance with shift operation by the driver, movable member 90 is pivoted around pivot shaft A to a position corresponding to a shift position.

Movable contacts M1 to M4 are fixed to movable member 90. Therefore, as movable member 90 is pivoted to the position corresponding to the shift position, four movable contacts M1 to M4 are also pivoted to the position corresponding to the shift position.

Fixed contacts T1 to T7 are arranged on any of four concentric tracks R1 to R4 around pivot shaft A, so as not to cross one another. In this way, fixed contacts T1 to T7 are arranged substantially parallel to a pivot path of movable member 90 (pivot path of movable contacts M1 to M4).

Power supply terminals B1, B2 are supplied with predetermined voltage (for example, a voltage of about 12 volts) through shift wire W from a not-shown single terminal.

Power supply terminal B1 is configured to extend substantially parallel to tracks R1, R2 on a track RB1 between track R1 and track R2, and to be constantly in contact with movable contacts M1, M2. Power supply terminal B2 is configured to extend substantially parallel to tracks R3, R4 on a track RB2 between track R3 and track R4, and to be constantly in contact with movable contacts M3, M4.

Fixed contacts T1 to T7 are brought into conduction with power supply terminals B1, B2, by coming into contact with movable contacts M1 to M4 in accordance with the positions of movable contacts M1 to M4. In this way, predetermined voltage is supplied to fixed contacts T1 to T7 from power supply terminals B1, B2. The voltage supplied to each of fixed contacts T1 to T7 from power supply terminals B1, B2 through movable contacts M1 to M4 is output as a shift signal to ECU 800 through shift wire W.

Figure 4:
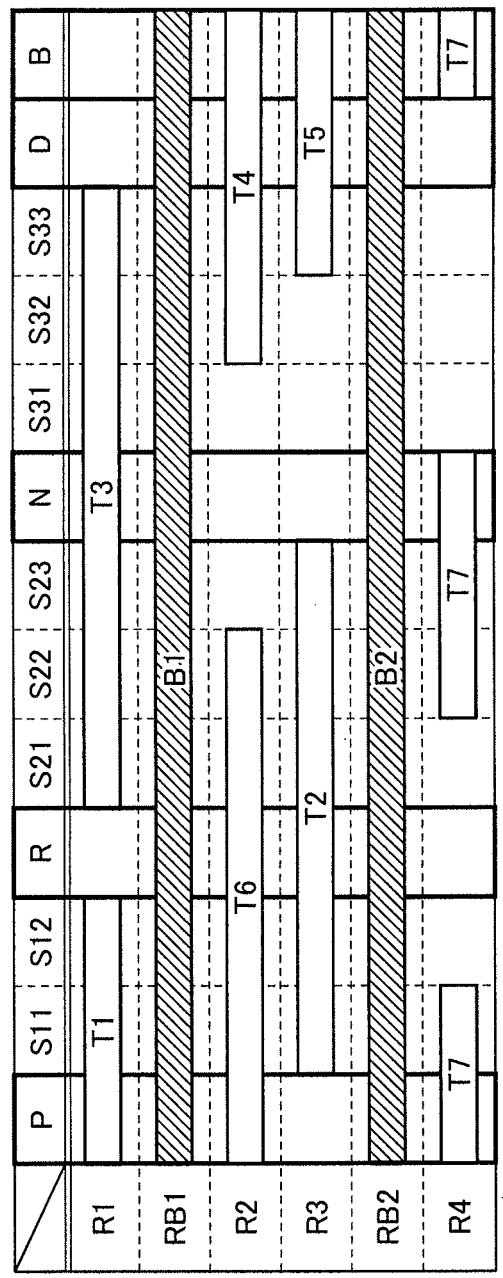
FIG. 4 is a diagram schematically showing an arrangement of fixed contacts T1 to T7.

FIG. 4 is a diagram schematically showing an arrangement of fixed contacts T1 to T7. The horizontal axis in FIG. 4 corresponds to a shift position (position of shift lever 91). That is, based on the P position as a reference, the shift position is moved to the P position, an S1 (S11, S12) position, the R position, an S2 (S21, S22) position, the N position, an S3 (S31, S32, S33) position, the D position, and the B position, in this order.

The S1 to S3 positions are intermediate positions arranged between the P and R positions, between the R and N positions, and between the N and D positions, respectively. The S1 position is further classified into the two positions, S11 and S12. The S2 position is further classified into the two positions, S21 and S22. The S3 position is further classified into the three positions, S31, S32, and S33.

As shown in FIG. 4, fixed contacts T1, T3 are arranged on track R1. Fixed contact T1 is arranged in a position between the P position and the S12 position. Fixed contact T3 is arranged in a position between the S21 position and the S33 position.

Fixed contacts T6, T4 are arranged on track R2. Fixed contact T6 is arranged in a position between the P position and the S22 position. Fixed contact T4 is arranged in a position between the S32 position and the B position.

Fixed contacts T2, T5 are arranged on track R3. Fixed contact T2 is arranged in a position between the S11 position and the S23 position. Fixed contact T5 is arranged in a position between the S33 position and the B position.

Fixed contact T7 is arranged on track R4. Fixed contact T7 is arranged in a position between the P position and the S11 position, in a position between the S22 position and the N position, or in the B position.

Power supply terminals B1, B2 are arranged on tracks RB1, RB2, respectively. Both power supply terminals B1, B2 are arranged over the entire range from the P position to the B position.

Where the shift position is the P position, for example, fixed contacts T1, T6 come into contact with movable contacts M1, M2, respectively, and are brought into conduction with power supply terminal B1 (turned on), and simultaneously, fixed contact T7 comes into contact with movable contact M4 and is brought into conduction with power supply terminal B2 (turned on). Thus, voltage signals from fixed contacts T1, T6, T7 are output as shift signals from shift sensor 80 to ECU 800. Where the shift position is the D position, for example, fixed contacts T4, T5 come into contact with movable contacts M2, M3, respectively, and are brought into conduction with power supply terminals B1, B2, respectively (turned on). Thus, voltage signals from fixed contacts T4, T5 are output as shift signals from shift sensor 80 to ECU 800. The same also applies to the other shift positions.

Figures 5, 6:
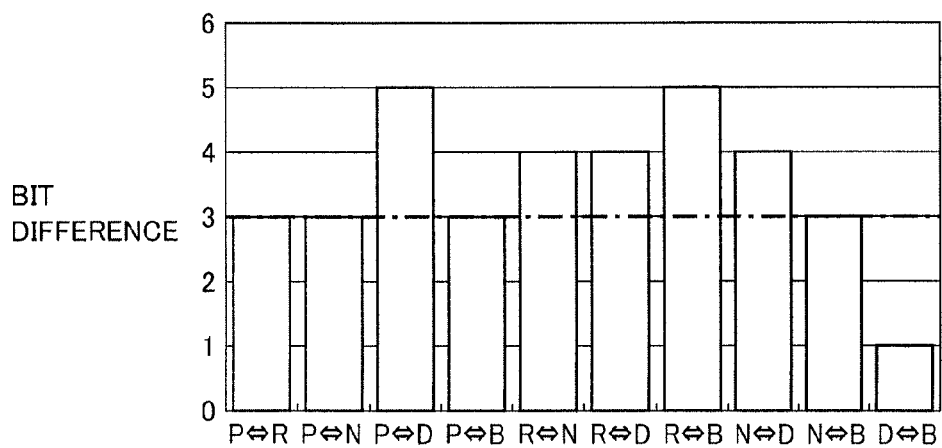
FIG. 5 is a diagram showing ON/OFF timing of each shift signal.
FIG. 6 is a diagram showing the number of shift signals that differ between shift patterns of P, R, N, D, and B.

FIG. 5 is a diagram showing ON/OFF timing of each shift signal. In FIG. 5, the horizontal axis shows types of shift signals (classification of fixed contacts T1 to T7), and the vertical axis shows shift positions, wherein "1" represents an "ON (a conductive state between power supply terminal B and each of fixed contacts T1 to T7)" state of each shift signal, and a blank field represents an "OFF (a non-conductive state between power supply terminal B and each of fixed contacts T1 to T7)" state of each shift signal. A shift signal output from a fixed contact Tn (n=1 to 7) is hereinafter also denoted as "shift signal Tn".

A combination of shift signals (hereinafter also referred to as a "shift pattern") changes in the order shown in FIG. 5, in accordance with the movement of shift lever 91. For example, where the shift position is the D position, the shift pattern is a D pattern (only shift signals T4, T5 are turned on). When the user moves the shift position from this state to the N position, the shift pattern changes to an S33 pattern, an S32 pattern, an S31 pattern, and an N pattern, in this order. That is, from the D pattern in which only shift signals T4, T5 are turned on, shift signal T3 is first changed into the ON state to enter the S33 pattern, shift signal T5 is then changed into the OFF state to enter the S32 pattern, shift signal T4 is then changed into the OFF state to enter the S31 pattern, and lastly, shift signal T7 is changed into the ON state to enter the N pattern.

As shown in FIG. 5, each of fixed contacts T1 to T7 is arranged such that the ON/OFF timing of one shift signal is different from that of another shift signal.

FIG. 6 is a diagram showing the number of shift signals that differ between shift patterns of P, R, N, D, and B. As shown in FIG. 6, except for between the D and B patterns, each of fixed contacts T1 to T7 is arranged such that the number of shift signals that differ between shift patterns is each three or more. Particularly, each of fixed contacts T1 to T7 is arranged such that the number of shift signals that differ between the D pattern and another pattern (any of the P, R, and N patterns) is four or more. The number of shift signals that differ between the D and B patterns is set to 1.

A function of shift sensor 80 having the structure as described above will be described below. Shift sensor 80 according to the present embodiment has all of the following features in terms of manufacture (cost), performance, and fail-safe.

<In Terms of Manufacture (Cost)>

In terms of manufacture, shift sensor 80 according to the present embodiment has all of the four features described below, and is advantageous in terms of cost.

(1) Shift sensor 80 is constituted of four movable contacts M1 to M4.

(2) Power supply terminals B1, B2 receive voltage signals from a single terminal, and power supply terminals B1, B2 are arranged between tracks R1 and R2, and between tracks R3 and R4, respectively.

(3) Fixed contacts T1 to T7 are arranged on tracks R1 to R4 so as not to cross one another. Therefore, it is possible to manufacture fixed contacts T1 to T7 by punching a single plate of metal (for example, a silver-plated copper plate) in a progressive step, thus achieving reduction in manufacturing costs by simplifying the manufacturing process.

(4) Each of fixed contacts T1 to T7 is arranged such that the number of shift signals that differ between shift patterns of P, R, N, and D is three or more (see FIG. 6). Therefore, if, for example, the number of shift signals that differ between the P and N patterns is 1, it will be necessary to provide an additional resistor for preventing an erroneous determination between these shift ranges; however, by using shift sensor 80 according to the present embodiment, such a resistor need not be provided, thus achieving cost reduction.

<In Terms of Performance)

In terms of performance, shift sensor 80 according to the present embodiment has all of the three features described below, and can exhibit high performance.

(1) Each of fixed contacts T1 to T7 is arranged such that the five shift positions (shift ranges) of P, R, N, D, and B can be uniquely detected in accordance with the shift pattern.

(2) Each of fixed contacts T1 to T7 is arranged such that the ON/OFF timing of one shift signal (timing of contact/non-contact between each of fixed contacts T1 to T7 and each of movable contacts M1 to M4) is different from that of another shift signal (see FIG. 5).

(3) Each of fixed contacts T1 to T7 is arranged to be able to output two or more different shift patterns in accordance with the shift position, in each of the intermediate positions (S1 to S3 positions) arranged between the P and R positions, between the R and N positions, and between the N and D positions. In this way, a shift pattern that cannot be set by a user's operation can be detected in an intermediate position as well. This enables a failure diagnosis of shift sensor 80. Specifically, when any one of fixed contacts T1 to T7 has failed, the failure can be detected at any of the shift positions.

<In Terms of Fail-Safe>

In terms of fail-safe, shift sensor 80 according to the present embodiment has all of the two features described below, and can ensure fail-safe performance.

(1) Each of fixed contacts T1 to T7 is arranged such that the number of shift signals that differ between shift patterns of P, R, N, and D is each three or more (see FIG. 6). Therefore, fail-safe performance even in view of a double failure (a case where any two of fixed contacts T1 to T7 have failed) can be ensured. Specifically, even if a double failure has occurred in a certain shift range (for example, the D range), the shift pattern is different from, for example, the R pattern or P pattern. Therefore, erroneous recognition as the R range or the P range can be prevented.

(2) Particularly, each of fixed contacts T1 to T7 is arranged such that the number of shift signals that differ between the D pattern and any of the P, R, and N patterns is four or more. Therefore, in respect of the D range, fail-safe performance at the time of a failure can be ensured even in view of a triple failure. Specifically, in the event of one failure during running in the D range, even if a double failure further occurs after that (even if a total of three failures occur), prevention of an erroneous determination as another range can be ensured, allowing the vehicle to continue running.

In shift sensor 80 according to the present embodiment, the number of shift signals that differ between the D and B patterns is set to 1. This is because, an erroneous determination at the time of one failure may be permitted between the D and B ranges, as vehicle 1 is caused to run forward in both these ranges, and priority is placed on preventing an erroneous determination between ranges other than between the D and B ranges. It is noted that the number of shift signals that differ between the D and B patterns is not limited to 1, and may also be set to 2 or more.

Shift sensor 80 according to the present embodiment has realized all of the above-described features in terms of manufacture, performance, and fail-safe, with a relatively small number, "seven (seven types)", of shift signals T1 to T7. Accordingly, in the present embodiment, a shift sensor for shift-by-wire that is advantageous both in terms of cost and performance and can also ensure fail-safe performance can be realized.

[Modifications]

In the foregoing embodiment, as described in (2) of <In Terms of Fail-Safe>, each of fixed contacts T1 to T7 is arranged such that the number of shift signals that differ between the D pattern and any of the P, R, and N patterns is four or more, in order to ensure that, in respect of the D range, an erroneous determination does not occur even in the event of a triple failure (in order to allow the vehicle to continue running even if one failure is followed by a double failure, in respect of the D range).

This requirement, however, may not necessarily be satisfied. The number of shift signals that differ between the D pattern and any of the P, R, and N patterns may be changed to "three or more", rather than "four or more".

Figure 7:
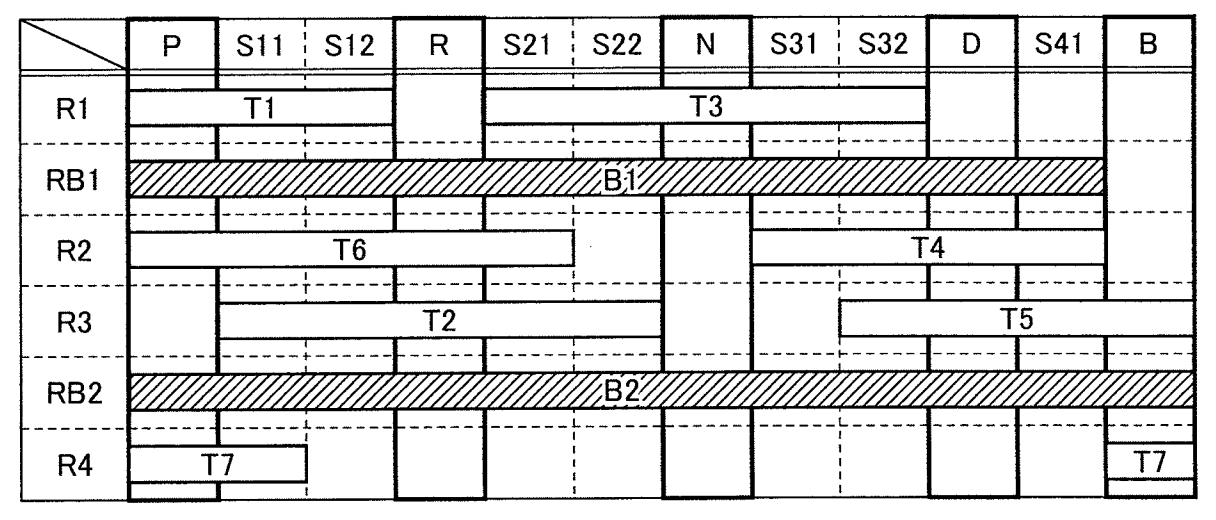

FIG. 7 is a diagram schematically showing a first modification of the arrangement of fixed contacts T1 to T7. FIG. 8 is a diagram showing ON/OFF timing of each shift signal in the first modification.

Figure 9:
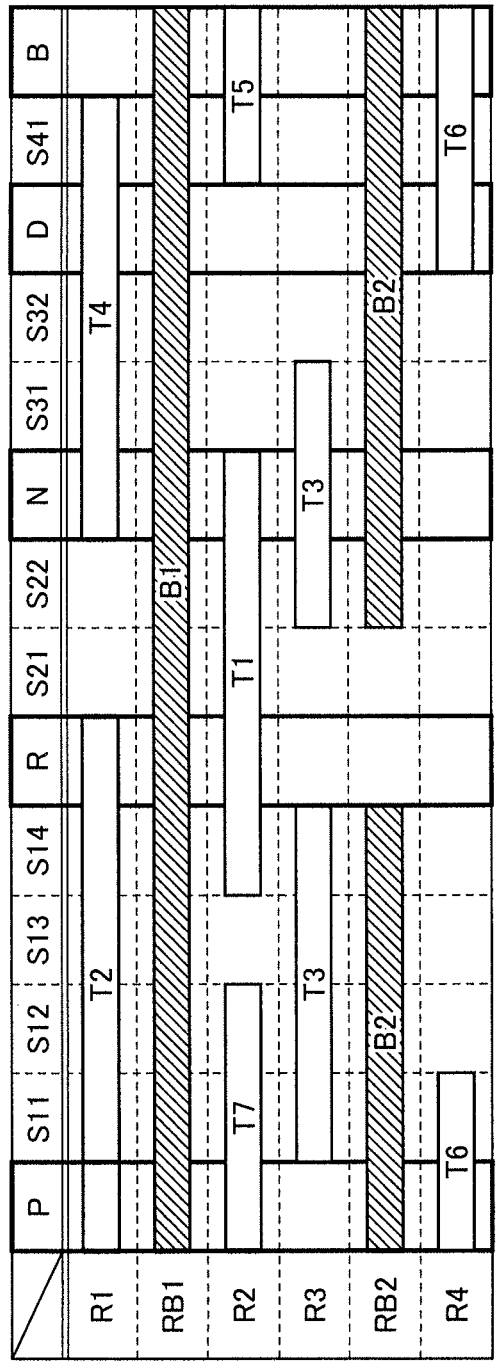
FIG. 9 is a diagram schematically showing a second modification of the arrangement of fixed contacts T1 to T7.

FIG. 9 is a diagram schematically showing a second modification of the arrangement of fixed contacts T1 to T7. FIG. 10 is a diagram showing ON/OFF timing of each shift signal in the second modification.

As can be seen from FIGS. 7 to 10, in each of the modifications, although the shift sensor does not possess the feature described in (2) of <In Terms of Fail-Safe>above because the number of shift signals that differ between the D pattern and any of the P, R, and N patterns is not "four or more", other features are the same as those in the foregoing embodiment, and a shift sensor for shift-by-wire that is advantageous both in terms of cost and performance and can also ensure fail-safe performance can be realized.

It should be understood that the embodiments disclosed herein are illustrative and non-restrictive in every respect. The scope of the present invention is defined by the terms of the claims, rather than by the foregoing description, and is intended to include any modifications within the scope and meaning equivalent to the terms of the claims.

Reference Signs List

1: vehicle, 10: switch, 20: accelerator position sensor, 21: accelerator pedal, 30: brake stroke sensor, 31: brake pedal, 40: steering angle sensor, 41: steering wheel, 50: vehicle speed sensor, 80: shift sensor, 90: movable member, 91: shift lever, 92: push-pull cable, 93: shift gate, 93A: groove, 100: drive device, 200: transmission device, 210: output shaft, 300: wheel, 800: ECU, A: pivot shaft, B, B1, B2: power supply terminal, C: shift connector, M1 to M4: movable contact, R1 to R4, RB1, RB2: track, T1 to T7: fixed contact (shift signal), and W: shift wire.

The invention claimed is:

1. A shift sensor for detecting a shift range requested by a user by electrically detecting a position of a movable member operated by the user, comprising:

a movable contact configured to be movable to a position corresponding to the position of said movable member;

a power supply terminal extending substantially parallel to a movement path of said movable contact and being constantly in contact with said movable contact; and a plurality of fixed contacts each extending substantially parallel to the movement path of said movable contact, for outputting a signal by coming into contact with said movable contact in accordance with the position of said movable contact, said plurality of fixed contacts being arranged such that the number of signals that differ between signal patterns including a signal pattern for a parking position, a signal pattern for a rearward position, a signal pattern for a neutral position, and a signal pattern for a forward position is three or more, and said plurality of fixed contacts being arranged such that the number of signals that differ between the signal pattern for said forward position and the signal pattern for said parking position, the number of signals that differ between the signal pattern for said forward position and the signal pattern for said rearward position, and the number of signals that differ between the signal pattern for said forward position and the signal pattern for said neutral position are all four or more.

2. The shift sensor according to claim 1, wherein said plurality of fixed contacts are arranged to be able to output two or more different signal patterns in accordance with the position of said movable member, in each of an intermediate position between said parking position and said rearward position, an intermediate position between said rearward position and said neutral position, and an intermediate position between said neutral position and said forward position.

3. The shift sensor according to claim 1, wherein said plurality of fixed contacts are arranged on any of a plurality of tracks substantially parallel to the movement path of said movable contact, so as not to cross one another.

4. The shift sensor according to claim 3, wherein said plurality of tracks are constituted of a first track, a second track, a third track, and a fourth track, said power supply terminal is constituted of a first power supply terminal arranged between said first track and said second track and a second power supply terminal arranged between said third track and said fourth track, and said movable contact is constituted of a first movable contact configured to allow conduction between said first power supply terminal and said fixed contact on said first track, a second movable contact configured to allow conduction between said first power supply terminal and said fixed contact on said second track, a third movable contact configured to allow conduction between said second power supply terminal and said fixed contact on said third track, and a fourth movable contact configured to allow conduction between said second power supply terminal and said fixed contact on said fourth track.

5. A vehicle, comprising:

a shift sensor for detecting a shift range requested by a user by electrically detecting a position of a movable member operated by the user, said shift sensor including a movable contact configured to be movable to a position corresponding to the position of said movable member, a power supply terminal extending substantially parallel to a movement path of said movable contact and being constantly in contact with said movable contact, and a plurality of fixed contacts each extending substantially parallel to the movement path of said movable contact, for outputting a signal by coming into contact with said movable contact in accordance with the position of said movable contact, said plurality of fixed contacts being arranged such that the number of signals that differ between signal patterns including a signal pattern for a parking position, a signal pattern for a rearward position, a signal pattern for a neutral position, and a signal pattern for a forward position is three or more, and said plurality of fixed contacts being arranged such that the number of signals that differ between the signal pattern for said forward position and the signal pattern for said parking position, the number of signals that differ between the signal pattern for said forward position and the signal pattern for said rearward position, and the number of signals that differ between the signal pattern for said forward position and the signal pattern for said neutral position are all four or more.

\* \* \* \* \*